(12) United States Patent
Chen et al.

(10) Patent No.: US 10,700,161 B2
(45) Date of Patent: Jun. 30, 2020

(54) SUBSTRATE STRUCTURE AND MANUFACTURING METHOD THEREOF

(71) Applicant: Unimicron Technology Corp., Taoyuan (TW)

(72) Inventors: Yu-Hua Chen, Hsinchu (TW); Fu-Yang Chen, Miaoli County (TW); Chun-Hsien Chien, New Taipei (TW); Chien-Chou Chen, Hsinchu County (TW); Wei-Ti Lin, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/159,726

(22) Filed: Oct. 15, 2018

(65) Prior Publication Data

US 2020/0075711 A1 Mar. 5, 2020

(30) Foreign Application Priority Data

Aug. 29, 2018 (TW) .............................. 107130092 A

(51) Int. Cl.
*H01L 49/02* (2006.01)
*H01L 23/522* (2006.01)
(Continued)

(52) U.S. Cl.
CPC .............. *H01L 28/60* (2013.01); *H01L 23/15* (2013.01); *H01L 23/49811* (2013.01);
(Continued)

(58) Field of Classification Search
CPC ................. H01L 28/60; H01L 23/5223; H01L 23/53233; H01L 23/5226; H01L 23/49811; H01L 23/15; H01L 23/142; H01L 23/145; H01L 23/147; H01L 49/00; H01L 49/02; H01L 2224/0233; H01L 2224/02373; H01L 2224/023
See application file for complete search history.

(56) References Cited

U.S. PATENT DOCUMENTS

2011/0062549 A1* 3/2011 Lin ..................... H01L 23/3128
257/531
2015/0035162 A1 2/2015 Lan et al.
(Continued)

*Primary Examiner* — Galina G Yushina
(74) *Attorney, Agent, or Firm* — JCIPRNET

(57) ABSTRACT

A manufacturing method of a substrate structure includes the following steps. A first build-up circuit structure is formed. At least one copper pillar is formed on the first build-up circuit structure. A dielectric layer is formed on the first build-up circuit structure, and the dielectric layer wraps the copper pillar. A second build-up circuit structure and a capacitive element are formed on the dielectric layer. In particular, the second build-up circuit structure and the first build-up circuit structure are respectively located at two opposite sides of the dielectric layer. The capacitive element is disposed in a capacitive element setting region within the second build-up circuit structure. The copper pillar penetrates the dielectric layer and is electrically connected to the second build-up circuit structure and the first build-up circuit structure. A substrate structure obtained by the manufacturing method of the substrate structure is provided.

9 Claims, 8 Drawing Sheets

(51) Int. Cl.
*H01L 23/498* (2006.01)
*H01L 23/15* (2006.01)
*H01L 23/532* (2006.01)

(52) U.S. Cl.
CPC ...... *H01L 23/5223* (2013.01); *H01L 23/5226* (2013.01); *H01L 23/53233* (2013.01)

(56) References Cited

U.S. PATENT DOCUMENTS

2017/0103946 A1* 4/2017 Chang ................. H01L 21/4853
2017/0345726 A1* 11/2017 Huang ............. H01L 21/76879
2018/0261665 A1* 9/2018 Yoshizawa ............. H01L 24/09

* cited by examiner and manufacturing method thereof

CROSS REFERENCE TO RELATED APPLICATION

This application claims the priority benefit of Taiwan application serial no. 107130092, filed on Aug. 29, 2018. The entirety of the above-mentioned patent application is hereby incorporated by reference herein and made a part of specification.

BACKGROUND OF THE INVENTION

Field of the Invention

The invention relates to a substrate structure and a manufacturing method thereof, and more particularly, to a substrate structure having a copper pillar and a capacitive component and a manufacturing method thereof.

Description of Related Art

Currently, in the pursuit of power integrity in a circuit design, many passive elements (such as resistors, capacitors, and inductors) are usually added to filter out noise. The size of a regular discrete capacitor is greater, and the discrete capacitor is commonly soldered directly on a substrate, but sometimes the discrete capacitor is embedded in the substrate or a dielectric material layer to reduce the overall height. However, the length of the circuit connected to the capacitor is related to the size of the capacitor. If the circuit is too long, then the resistance of the circuit is increased, thereby increasing the power consumption ratio.

Although a miniaturized capacitive element may be produced via a wafer process to obtain a thinner capacitor with greater capacitance, the manufacture of the miniaturized capacitive element is complex and the quality is difficult to control. Moreover, since for an inductor formed by a through-glass via (TGV), the manufacturing cost is too high and the production time is also relatively long, a high yield cannot be achieved by the prior art. Therefore, how to integrate the passive elements while simplifying the process is an urgent issue in the art.

SUMMARY OF THE INVENTION

The invention provides a manufacturing method of a substrate structure having the advantages of simplified process, lowered cost, and increased yield.

The invention provides a substrate structure obtained by the manufacturing method of the substrate structure.

The manufacturing method of the substrate structure of the invention includes the following steps. A first build-up circuit structure is formed. At least one copper pillar is formed on the first build-up circuit structure. A dielectric layer is formed on the first build-up circuit structure, and the dielectric layer wraps the copper pillar. A second build-up circuit structure and a capacitive element are formed on the dielectric layer. In particular, the second build-up circuit structure and the first build-up circuit structure are respectively located at two opposite sides of the dielectric layer. The capacitive element is disposed in a capacitive element setting region within the second build-up circuit structure. The copper pillar penetrates the dielectric layer and is electrically connected to the second build-up circuit structure and the first build-up circuit structure.

In an embodiment of the invention, before the first build-up circuit structure is formed, the following steps are further included. A glass substrate is provided. A release layer is formed on the glass substrate. In particular, the glass substrate and the dielectric layer are respectively located at two opposite sides of the first build-up circuit structure. The release layer is located between the first build-up circuit structure and the glass substrate.

In an embodiment of the invention, the step of forming the first build-up circuit structure includes the following steps. A first patterned circuit layer is formed on the release layer. A first dielectric layer is formed on the first patterned circuit layer. A first conductive via is formed on the first patterned circuit layer, wherein the first conductive via penetrates the first dielectric layer. A second patterned circuit layer is formed on the first dielectric layer. A second dielectric layer is formed on the second patterned circuit layer. In particular, the first patterned circuit layer is electrically connected to the second patterned circuit layer via the first conductive via.

In an embodiment of the invention, the copper pillar penetrates the second dielectric layer of the first build-up circuit structure and is electrically connected to the second patterned circuit layer.

In an embodiment of the invention, the step of forming the second build-up circuit structure and the capacitive element on the dielectric layer includes the following steps. A third patterned circuit layer is formed on the dielectric layer. The capacitive element is disposed in the capacitive element sitting region on the dielectric layer. A third dielectric layer is formed on the third patterned circuit layer, and the third dielectric layer covers the third patterned circuit layer and the capacitive element. A plurality of second conductive vias are formed on the third patterned circuit layer, wherein the second conductive vias penetrate the third dielectric layer. A fourth patterned circuit layer is formed on the third dielectric layer, wherein the fourth patterned circuit layer and the third patterned circuit layer are respectively located at two opposite sides of the third dielectric layer. The fourth patterned circuit layer is electrically connected to the third patterned circuit layer via the second conductive vias. The fourth patterned circuit layer is electrically connected to the capacitive element via the second conductive vias.

In an embodiment of the invention, the capacitive element is disposed between the fourth patterned circuit layer and the dielectric layer.

In an embodiment of the invention, the step of forming the capacitive element includes the following steps. A first electrode is formed on the dielectric layer at the same time of forming the third patterned circuit layer, wherein the first electrode is disposed in the capacitive element setting region. A fourth dielectric layer is formed on the first electrode. A second electrode is formed on the fourth dielectric layer of the capacitive element sitting region. A portion of the second electrode and the fourth dielectric layer are removed.

In an embodiment of the invention, the second electrode includes a titanium layer and a copper layer. The copper layer and the fourth dielectric layer are respectively located at two opposite sides of the titanium layer.

In an embodiment of the invention, the capacitive element includes a first electrode, a fourth dielectric layer, and a second electrode. The first electrode is disposed on the dielectric layer. The fourth dielectric layer is disposed on the first electrode. The second electrode is disposed on the fourth dielectric layer. The second electrode and the first electrode are respectively located at two opposite sides of the fourth dielectric layer.

In an embodiment of the invention, after the second build-up circuit structure and the capacitive element are formed on the dielectric layer, the following steps are further included. A patterned solder mask is formed on the second build-up circuit structure. In particular, the patterned solder mask and the dielectric layer are respectively located at two opposite sides of the second build-up circuit structure. Next, the release layer and the glass substrate are separated to form the substrate structure.

In an embodiment of the invention, the manufacturing method of the substrate structure further includes the following. An adhesive layer is formed. The capacitive element is disposed in the capacitive element sitting region on the dielectric layer via the adhesive layer.

The substrate structure of the invention includes a first build-up circuit structure, a dielectric layer, a second build-up circuit structure, at least one copper pillar, and a capacitive element. The dielectric layer is disposed on the first build-up circuit structure. The second build-up circuit structure is disposed on the dielectric layer. The second build-up circuit structure and the first build-up circuit structure are respectively located at two opposite sides of the dielectric layer. The copper pillar penetrates the dielectric layer and is electrically connected to the second build-up circuit structure and the first build-up circuit structure. The capacitive element is disposed in a capacitive element setting region within the second build-up circuit structure.

In an embodiment of the invention, the substrate structure further includes a glass substrate and a release layer. The glass substrate is disposed on the first build-up circuit structure, wherein the dielectric layer and the glass substrate are respectively located at two opposite sides of the first build-up circuit structure. The release layer is disposed on the glass substrate, wherein the release layer is located between the first build-up circuit structure and the glass substrate.

In an embodiment of the invention, the first build-up circuit structure includes a first patterned circuit layer, a first dielectric layer, a second patterned circuit layer, a second dielectric layer, and at least one first conductive via. In particular, the first patterned circuit layer, the first dielectric layer, the second patterned circuit layer, and the second dielectric layer are sequentially stacked on the release layer. The first conductive via penetrates the first dielectric layer. The first patterned circuit layer is electrically connected to the second patterned circuit layer via the first conductive via.

In an embodiment of the invention, the second build-up circuit structure includes a third patterned circuit layer, a third dielectric layer, a fourth patterned circuit layer, and a plurality of second conductive vias. The third patterned circuit layer is disposed on the dielectric layer. The third dielectric layer is disposed on the third patterned circuit layer. The fourth patterned circuit layer is disposed on the third dielectric layer. The fourth patterned circuit layer and the third patterned circuit layer are respectively located at two opposite sides of the third dielectric layer. The second conductive vias penetrate the third dielectric layer. The fourth patterned circuit layer is electrically connected to the third patterned circuit layer via the second conductive vias. The fourth patterned circuit layer is electrically connected to the capacitive element via the second conductive vias.

In an embodiment of the invention, the capacitive element is disposed between the fourth patterned circuit layer and the dielectric layer.

In an embodiment of the invention, the substrate structure further includes a patterned solder mask. The patterned solder mask is disposed on the second build-up circuit structure. The patterned solder mask and the dielectric layer are respectively located at two opposite sides of the second build-up circuit structure.

Based on the above, in the substrate structure and the manufacturing method thereof of the invention, a first build-up circuit structure, a copper pillar, a dielectric layer, a second build-up circuit structure, and a capacitive element are sequentially formed. In particular, the second build-up circuit structure and the first build-up circuit structure are respectively located at two opposite sides of the dielectric layer. The capacitive element is disposed in the capacitive element setting region within the second build-up circuit structure. The copper pillar penetrates the dielectric layer and is electrically connected to the second build-up circuit structure and the first build-up circuit structure. Via this design, the substrate structure and the manufacturing method thereof of the invention have the advantages of simplified process, lowered cost, and increased yield.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
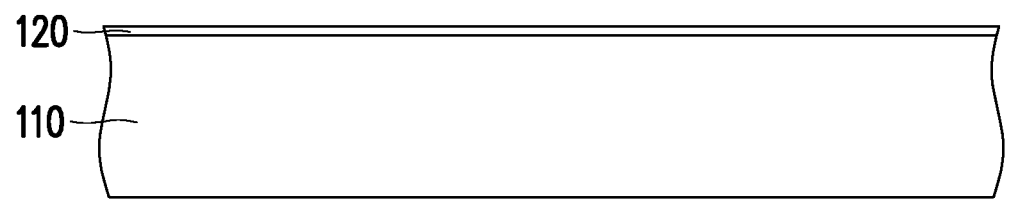
FIG. 1A to FIG. 1H show cross sections of a manufacturing method of a substrate structure of an embodiment of the invention.
Figure 1B:
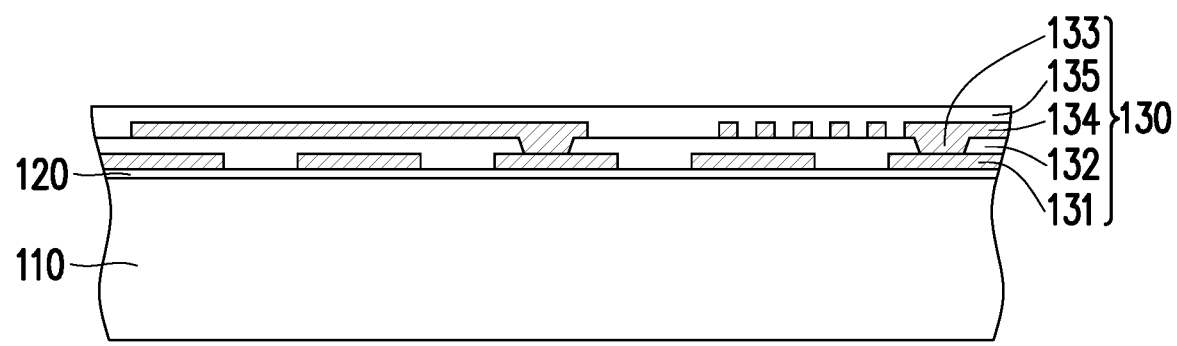
Figure 1C:
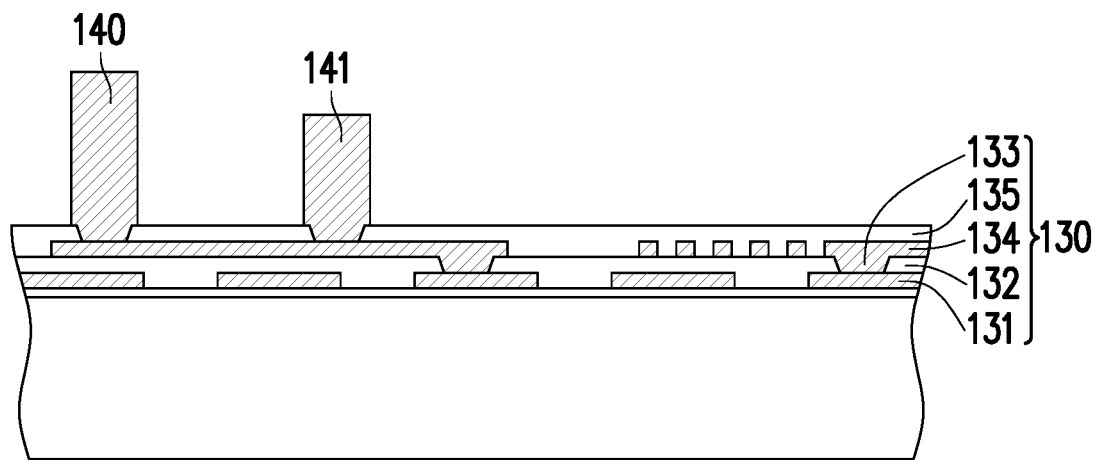
Figure 1D:
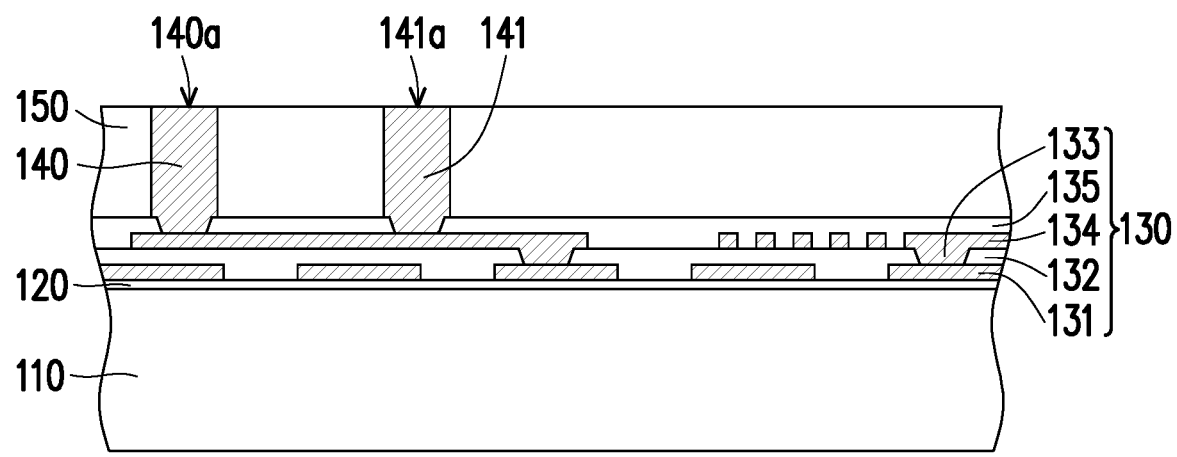
Figure 1E:
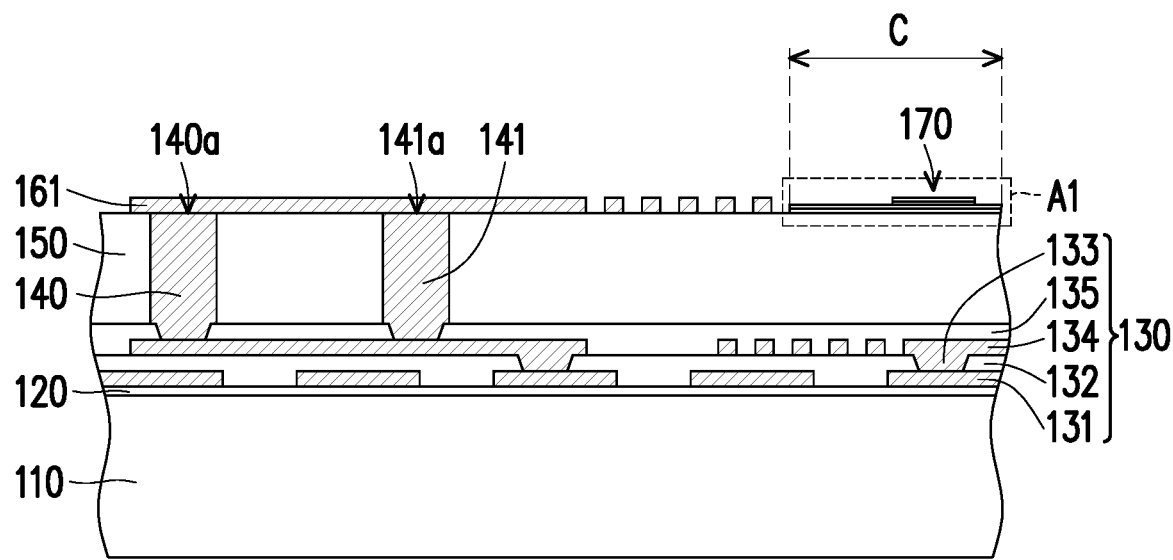
Figure 1F:
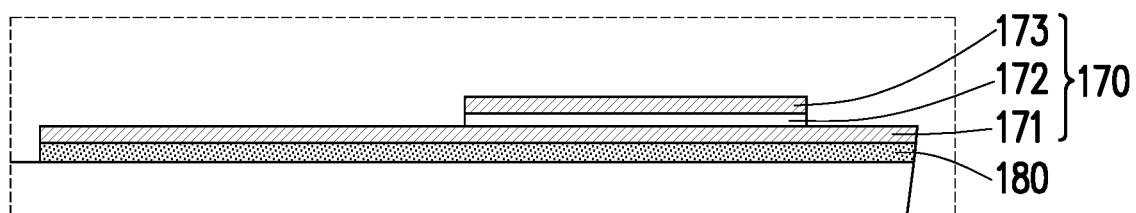
Figure 1G:
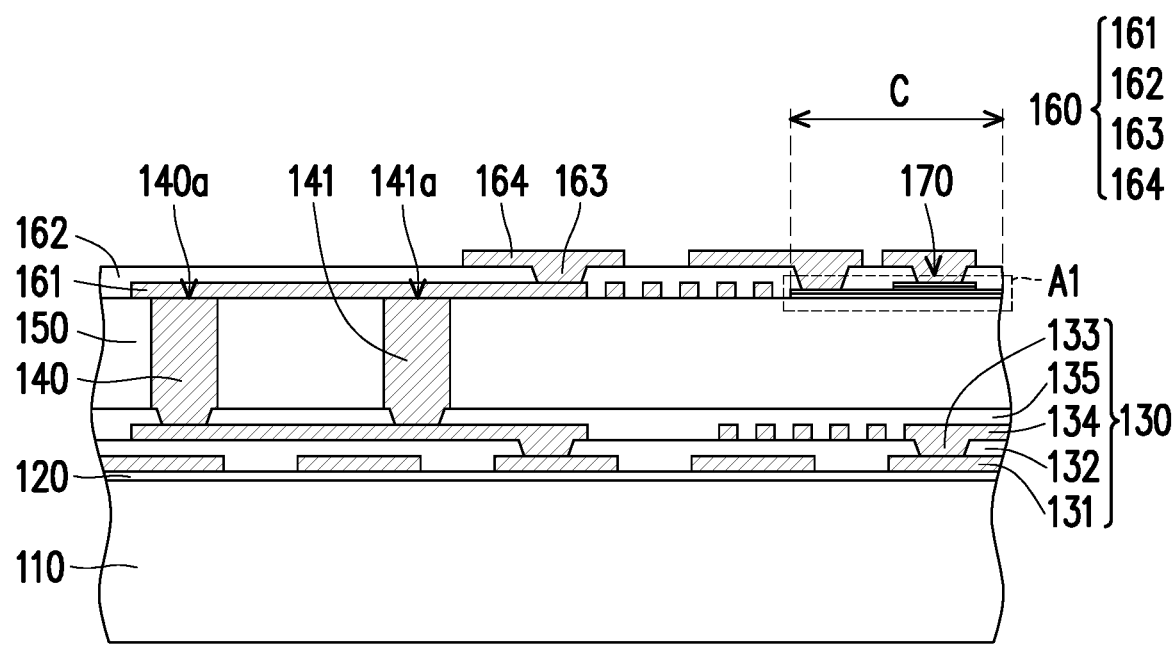
Figure 1H:
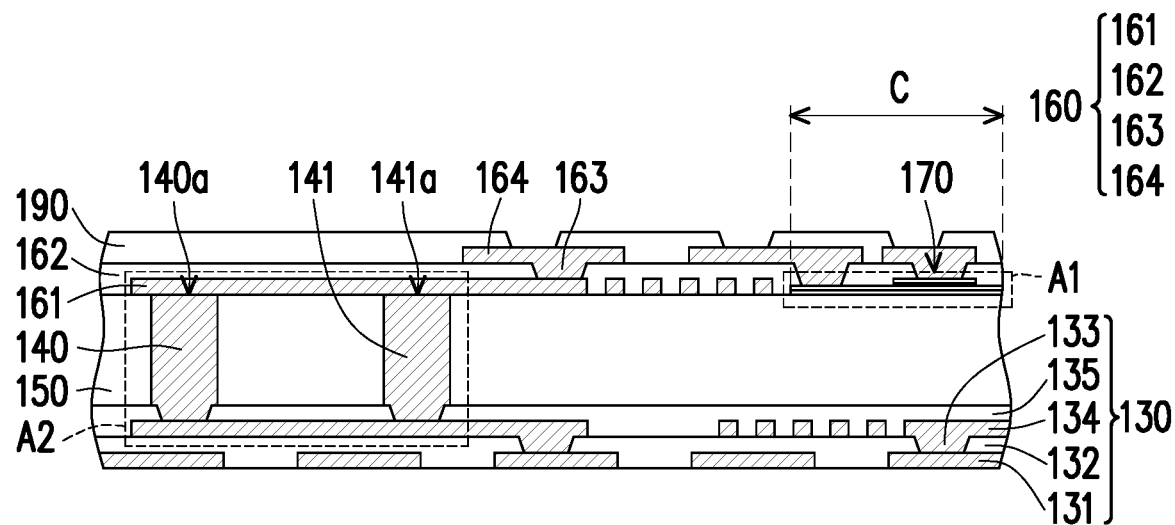
Figure 1I:
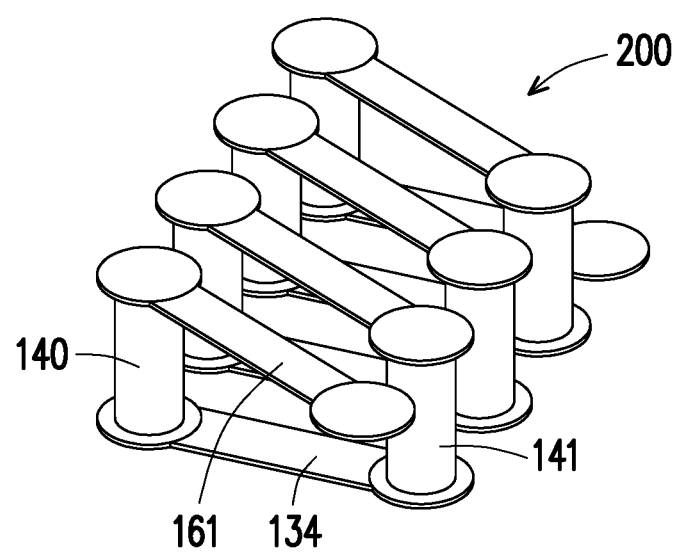
FIG. 1I shows a perspective view of region A2 in FIG. 1H.

FIG. 1A to FIG. 1I show cross sections of a manufacturing method of a substrate structure of an embodiment of the invention. FIG. 1I shows a perspective view of region A2 in FIG. 1H.

Referring first to FIG. 1A and FIG. 1B, a first build-up circuit structure 130 is formed. Specifically, in the present embodiment, a glass substrate 110 is first provided, and a release layer 120 is formed on the glass substrate 110. Next, the first build-up circuit structure 130 is formed according to the following steps. A first patterned circuit layer 131 is formed (such as via a photolithography method) on the release layer 120, a first dielectric layer 132 is formed on the first patterned circuit layer 131, drilling is performed on the first dielectric layer 132 (such as via a laser method) to expose a portion of the first patterned circuit layer 131, at least one first conductive via 133 (FIG. 1B schematically shows two) is formed on the exposed portion of the first patterned circuit layer 131, a second patterned circuit layer 134 is formed (such as via a photolithography method) on the first dielectric layer 132, and a second dielectric layer 135 is formed on the second patterned circuit layer 134. In particular, the first conductive via 133 penetrates first dielectric layer 132, and the first patterned circuit layer 131 may be electrically connected to the second patterned circuit layer 134 via the first conductive via 133. At this point, the manufacture of the first build-up circuit structure 130 is completed. In the present embodiment, the release layer 120 is located between the first build-up circuit structure 130 and the glass substrate 110. Here, the material of the first dielectric layer 132 and the second dielectric layer 135 is, for example, a polymer material or a resin material.

Next, referring to FIG. 1C, at least one copper pillar 140 and 141 (FIG. 1C schematically shows two) is formed on the first build-up circuit structure 130. Specifically, in the present embodiment, drilling is first performed on the second dielectric layer 135 to expose a portion of the second patterned circuit layer 134, for example. Another example is to form the at least one copper pillar 140 on a portion of the second patterned circuit layer 134 exposed by the first build-up circuit structure 130 via a photolithography method. At this point, the heights of the copper pillars 140 and 141 may be the same or different.

Next, referring to FIG. 1D, a dielectric layer 150 is formed on the first build-up circuit structure 130, and the dielectric layer 150 wraps the copper pillars 140 and 141. Specifically, in the present embodiment, the dielectric layer 150 is formed on the first build-up circuit structure 130 such that the dielectric layer 150 covers the second dielectric layer 135 and the dielectric layer 150 wraps the sides of the copper pillars 140 and 141 or completely wraps the copper pillars 140 and 141. Next, polishing is performed via, for example, a chemical mechanical polishing method to expose upper surfaces 140a and 141a of the copper pillars 140 and 141 and make the upper surfaces 140a and 141a of the copper pillars 140 and 141 level with the dielectric layer 150. At this point, the dielectric layer 150 and the glass substrate 110 are respectively located at two opposite sides of the first build-up circuit structure 130. Here, the material of the dielectric layer 150 is, for example, a silicone material or a resin-mixed material.

Next, referring to FIG. 1E to FIG. 1G simultaneously, a second build-up circuit structure 160 and a capacitive element 170 are formed on the dielectric layer 150. Specifically, in the present embodiment, the third patterned circuit layer 161 is first formed on the dielectric layer 150, wherein the third patterned circuit layer 161 covers the upper surfaces 140a and 141a of the copper pillars 140 and 141, and then the capacitive element 170 is disposed in a capacitive element sitting region C on the dielectric layer 150 via an adhesive layer 180. In particular, the capacitive element 170 is disposed between the fourth patterned circuit layer 164 and the dielectric layer 150, and the capacitive element 170 is level with the patterned circuit layer 161. Next, referring to FIG. 1F, FIG. 1F shows an enlarged view of region A1 in FIG. 1E, wherein the capacitive element 170 includes a first electrode 171, a fourth dielectric layer 172, and a second electrode 173. The first electrode 171 is disposed on the dielectric layer 150. The fourth dielectric layer 172 is disposed on the first electrode 171. The second electrode 173 is disposed on the fourth dielectric layer 172. The second electrode 173 and the first electrode 171 are respectively located at two opposite sides of the fourth dielectric layer 172. Here, the material of the fourth dielectric layer 172 is, for example, silicon oxide or other insulating resins or a metal oxide material, and is preferably, for example, aluminium oxide. Here, the material of the adhesive layer 180 is, for example, a viscous polymer material or resin material.

Next, referring to FIG. 1G, a third dielectric layer 162 is formed on the third patterned circuit layer 161, and the third dielectric layer 162 covers the third patterned circuit layer 161 and the capacitive element 170. Next, drilling is performed on the third dielectric layer 162 via, for example, a laser method to expose a portion of the third patterned circuit layer 161, the second electrode 173, and the first electrode 171. A plurality of second conductive vias 163 (FIG. 1G schematically shows three) are formed on the exposed portion of the third patterned circuit layer 161, the second electrode 173, and the first electrode 171, and the second conductive vias 163 penetrate the third dielectric layer 162. The fourth patterned circuit layer 164 is formed on the third dielectric layer 162. In particular, the fourth patterned circuit layer 164 and the third patterned circuit layer 161 are respectively located at two opposite sides of the third dielectric layer 162. The fourth patterned circuit layer 164 is electrically connected to the third patterned circuit layer 161 via the second conductive vias 163. The fourth patterned circuit layer 164 is electrically connected to the capacitive element 170 via the second conductive vias 163. Here, the material of the third dielectric layer 162 is, for example, a polymer material or a resin material. At this point, the manufacture of the second build-up circuit structure 160 and the capacitive element 170 is completed.

It should be mentioned that, although in the present embodiment, the capacitive element 170 formed is disposed on the dielectric layer 150 using the adhesive layer 180, the invention is not limited thereto. In other words, in other embodiments, a capacitive element may also be manufactured on the dielectric layer 150 using a semiconductor process.

Next, referring to FIG. 1H and FIG. 1I, a patterned solder mask 190 is formed on the second build-up circuit structure 160, and the release layer 120 and the glass substrate 110 are separated to form the substrate structure 100. Specifically, in the present embodiment, the patterned solder mask 190 is formed on the second build-up circuit structure 160 such that the patterned solder mask 190 and the dielectric layer 150 are respectively located at two opposite sides of the second build-up circuit structure 160. In particular, the patterned solder mask 190 covers the third dielectric layer 162 and exposes a portion of the fourth patterned circuit layer 164. Next, the release layer 120 and the glass substrate 110 are separated to complete the manufacture of the substrate structure 100.

It should be mentioned that, in the substrate structure 100 of the present embodiment, the second build-up circuit structure 160 and the first build-up circuit structure 130 are respectively located at two opposite sides of the dielectric layer 150. The capacitive element 170 is disposed in the capacitive element setting region C within the second build-up circuit structure 160. The copper pillars 140 and 141 penetrate the dielectric layer 150. The copper pillars 140 and 141 are electrically connected to the second build-up circuit structure 160 and the first build-up circuit structure 130.

FIG. 1I shows a perspective view of region A2 in FIG. 1H and omits the second dielectric layer 135. Referring further to both FIG. 1H and FIG. 1I, in the present embodiment, since the third patterned circuit layer 161, the copper pillars 140 and 141, and the second patterned circuit layer 134 may form an inductive element 200, the substrate structure 100 of the present embodiment may include both the inductive element 200 and the capacitive element 170, wherein the inductive element 200 is disposed in the dielectric layer 150, and the capacitive element 170 is disposed on the dielectric layer 150.

Based on the above, the substrate structure 100 of the present embodiment includes the first build-up circuit structure 130, the dielectric layer 150, the second build-up circuit structure 160, the at least one copper pillar 140 and 141, and the capacitive element 170. The dielectric layer 150 is disposed on the first build-up circuit structure 130. The second build-up circuit structure 160 is disposed on the dielectric layer 150. The second build-up circuit structure 160 and the first build-up circuit structure 130 are respectively located at two opposite sides of the dielectric layer 150. The copper pillars 140 and 141 penetrate the dielectric layer 150 and are electrically connected to the second build-up circuit structure 160 and the first build-up circuit structure 130. The capacitive element 170 is disposed in the capacitive element setting region C within the second build-up circuit structure 160.

It should be mentioned here that, the following embodiments adopt the reference numerals of the embodiments above and a portion of the contents thereof, wherein the same reference numerals are used to represent the same or similar elements and descriptions of the same technical contents are omitted. The omitted portions are as described in the embodiments above and are not repeated in the embodiments below.

FIG. 2A to FIG. 2F show cross-sections of a manufacturing method of a substrate structure of another embodiment of the invention. Referring to all of FIG. 1A to FIG. 1I and FIG. 2A to FIG. 2F, the manufacturing method of the substrate structure of the present embodiment is similar to the manufacturing method of the substrate structure in FIG. 1A to FIG. 1I, and the main difference between the two is that: in the present embodiment, a capacitive element 170a is manufactured on the dielectric layer 150 via a semiconductor process.

Specifically, in the manufacturing method of the substrate structure of the present embodiment, first, the first build-up circuit structure 130, the copper pillars 140 and 141, and the dielectric layer 150 are manufactured according to the steps of FIG. 1A to FIG. 1D.

Figure 2A:
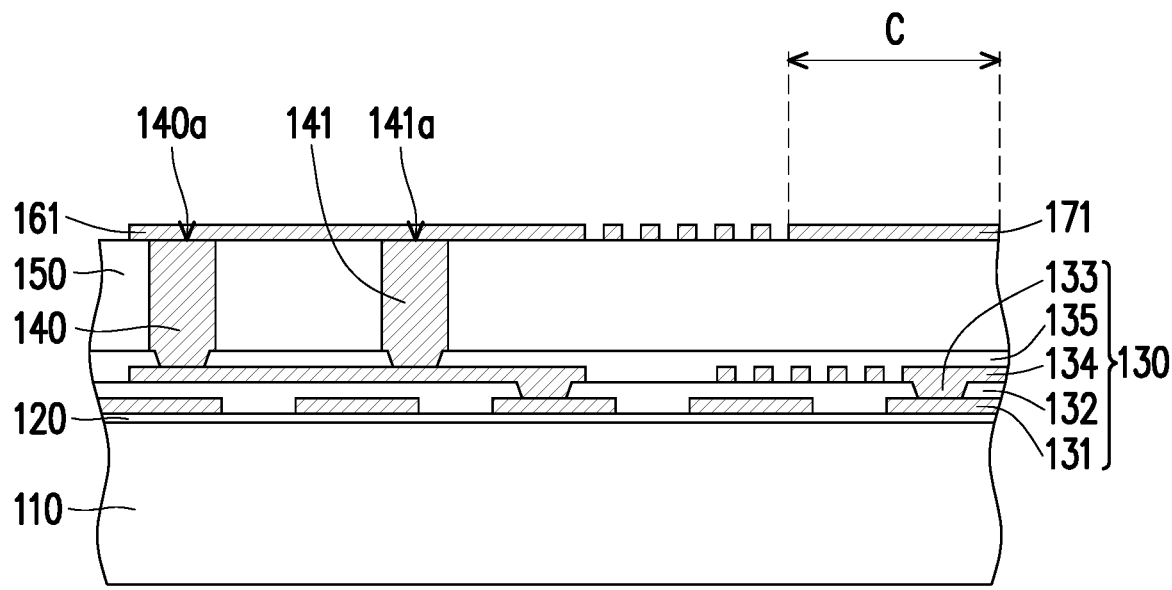
FIG. 2A to FIG. 2F show cross sections of a manufacturing method of a substrate structure of another embodiment of the invention.
Figure 2B:
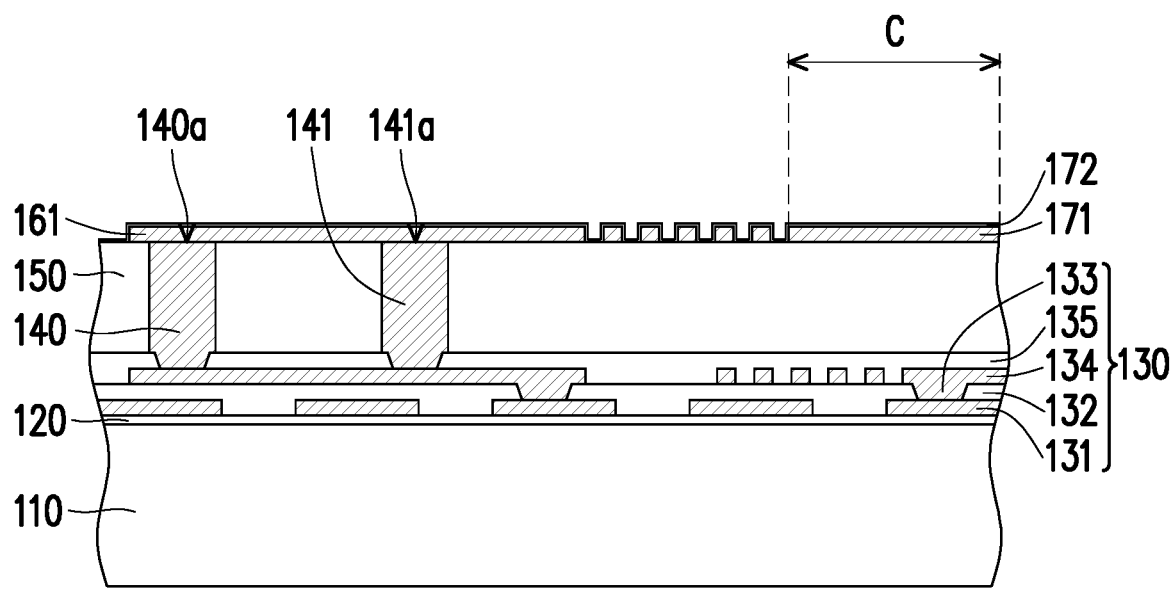
Figure 2C:
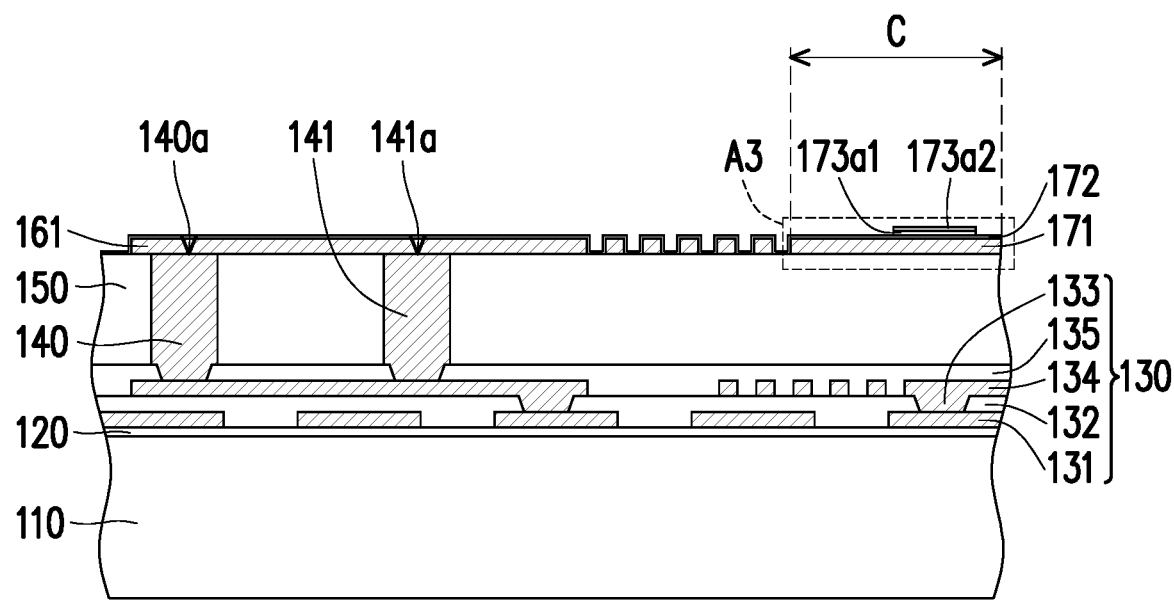
Figure 2D:
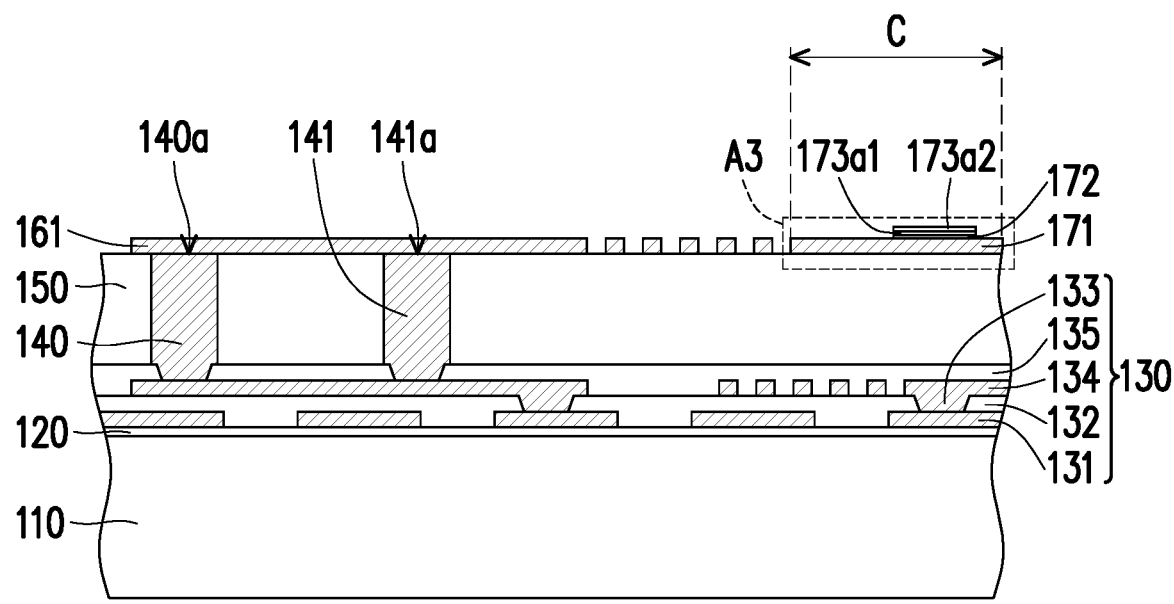
Figure 2E:
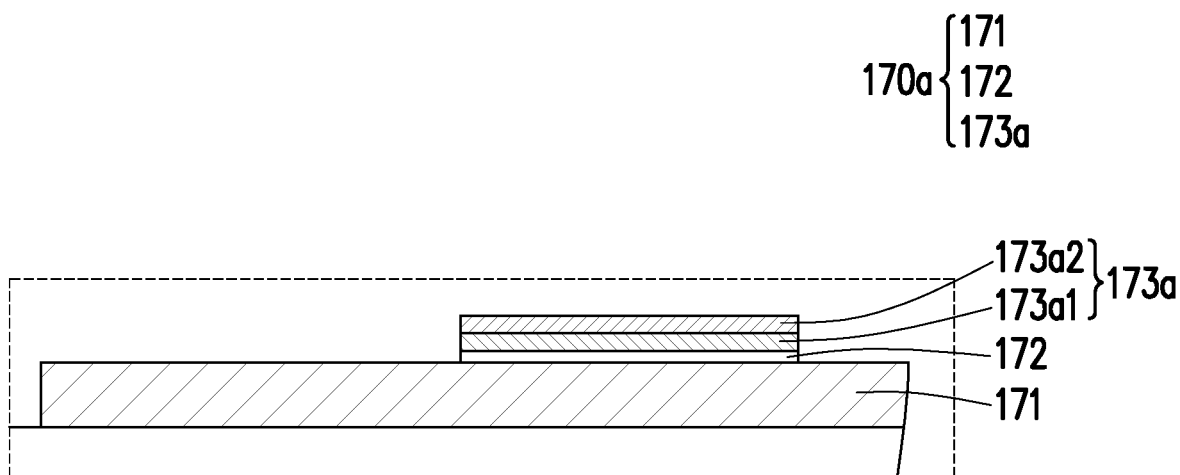

Next, referring to FIG. 2A to FIG. 2E, a capacitive element 170a is manufactured. FIG. 2E shows an enlarged view of region A3 in FIG. 2D. In the present embodiment, a first electrode 171 is formed on the dielectric layer 150 at the same time of forming the third patterned circuit layer 161, wherein the first electrode 171 is disposed in the capacitive element setting region C. Next, a fourth dielectric layer 172 is formed on the first electrode 171 via, for example, a chemical vapor deposition method, and the fourth dielectric layer 172 covers the third patterned circuit layer 161, the dielectric layer 150, and the first electrode 171. Next, for example, a titanium layer 173a1 and a copper layer 173a2 are sequentially formed on the fourth dielectric layer 172 via, for example, a sputtering method. Then, a portion of the titanium layer 173a1, the copper layer 173a2, and the fourth dielectric layer 172 are removed to form the capacitive element 170a. In particular, the titanium layer 173a1 and the copper layer 173a2 can be used as a second electrode 173a of the capacitive element 170a. The copper layer 173a2 and the fourth dielectric layer 172 are respectively located at two opposite sides of the titanium layer 173a1.

Figure 2F:
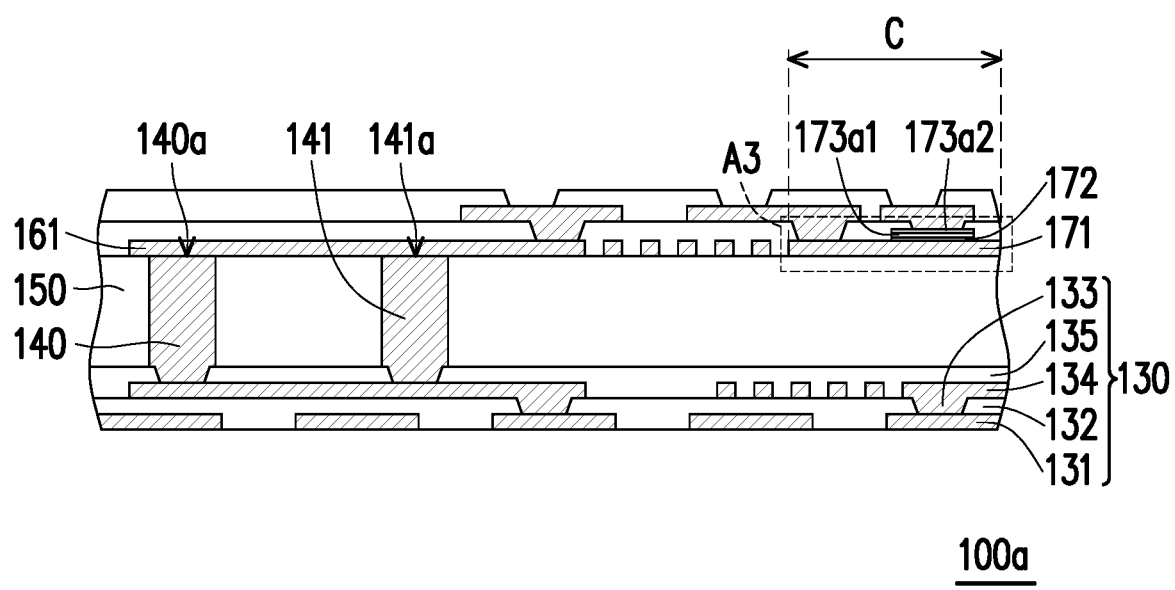

Lastly, the second build-up circuit structure 160 and the patterned solder mask 190 are manufactured according to the steps of FIG. 1G to FIG. 1I, and the release layer 120 and the glass substrate 110 are separated to complete the manufacture of the substrate structure 100a of the present embodiment, as shown in FIG. 2F.

Based on the above, in the substrate structure and the manufacturing method thereof of the invention, a first build-up circuit structure, a copper pillar, a dielectric layer, a second build-up circuit structure, and a capacitive element are sequentially formed. In particular, the second build-up circuit structure and the first build-up circuit structure are respectively located at two opposite sides of the dielectric layer. The capacitive element is disposed in the capacitive element setting region within the second build-up circuit structure. The copper pillar penetrates the dielectric layer and is electrically connected to the second build-up circuit structure and the first build-up circuit structure. Via this design, the substrate structure of the present embodiment may include an inductive element and a capacitive element simultaneously, wherein the inductive element is disposed in the dielectric layer, and the capacitive element is disposed on the dielectric layer. Therefore, compared to the prior art in which the conductive via of the inductive element is formed in the glass substrate, the substrate structure and the manufacturing method thereof of the invention have the advantages of simplified process, lowered cost, and increased yield.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A partially finished substrate structure, comprising:
   a first build-up circuit structure;
   a dielectric layer disposed on the first build-up circuit structure;
   a second build-up circuit structure disposed on the dielectric layer, wherein the second build-up circuit structure and the first build-up circuit structure are respectively located at two opposite sides of the dielectric layer;
   at least one first copper pillar and at least one second copper pillar penetrating the dielectric layer and electrically connected to the second build-up circuit structure and the first build-up circuit structure; and
   a capacitive element disposed in a capacitive element setting region within the second build-up circuit structure,
   wherein at least one first copper pillar, at least one second copper pillar, a second patterned circuit layer of the first build-up circuit structure, and a third patterned circuit layer of the second build-up circuit structure form an inductive element.

2. The partially finished substrate structure of claim 1, further comprising:
   a glass substrate disposed on the first build-up circuit structure, wherein the dielectric layer and the glass substrate are respectively located at two opposite sides of the first build-up circuit structure; and
   a release layer disposed on the glass substrate, wherein the release layer is located between the first build-up circuit structure and the glass substrate.

3. The partially finished substrate structure of claim 2, wherein the first build-up circuit structure comprises: a first patterned circuit layer, a first dielectric layer, the second patterned circuit layer, a second dielectric layer, and at least one first conductive via, wherein the first patterned circuit layer, the first dielectric layer, the second patterned circuit layer, and the second dielectric layer are sequentially stacked on the release layer, the at least one first conductive via penetrates the first dielectric layer, and the first patterned circuit layer is electrically connected to the second patterned circuit layer via the at least one first conductive via.

4. The partially finished substrate structure of claim 3, wherein the at least one copper pillar penetrates the second dielectric layer of the first build-up circuit structure and is electrically connected to the second patterned circuit layer.

5. The partially finished substrate structure of claim 1, wherein the second build-up circuit structure comprises:
- the third patterned circuit layer disposed on the dielectric layer;
- a third dielectric layer disposed on the third patterned circuit layer;
- a fourth patterned circuit layer disposed on the third dielectric layer, wherein the fourth patterned circuit layer and the third patterned circuit layer are respectively located at two opposite sides of the third dielectric layer; and
- a plurality of second conductive vias penetrating the third dielectric layer, wherein the fourth patterned circuit layer is electrically connected to the third patterned circuit layer via some of the second conductive vias, and the fourth patterned circuit layer is electrically connected to the capacitive element via others the second conductive vias.

6. The partially finished substrate structure of claim 5, wherein the capacitive element is disposed between the fourth patterned circuit layer and the dielectric layer.

7. The partially finished substrate structure of claim 1, wherein the capacitive element comprises:
- a first electrode disposed on the dielectric layer;
- a fourth dielectric layer disposed on the first electrode; and
- a second electrode disposed on the fourth dielectric layer, wherein the second electrode and the first electrode are respectively located at two opposite sides of the fourth dielectric layer.

8. The partially finished substrate structure of claim 1, further comprising:
- a patterned solder mask disposed on the second build-up circuit structure, wherein the patterned solder mask and the dielectric layer are respectively located at two opposite sides of the second build-up circuit structure.

9. The partially finished substrate structure of claim 1, further comprising:
- an adhesive layer, wherein the capacitive element is disposed in the capacitive element sitting region on the dielectric layer via the adhesive layer.

* * * * *